(12) United States Patent
Choung et al.

(10) Patent No.: US 8,765,614 B2
(45) Date of Patent: Jul. 1, 2014

(54) METHOD OF FORMING A METAL PATTERN AND METHOD OF MANUFACTURING A DISPLAY SUBSTRATE INCLUDING THE METAL PATTERN

(75) Inventors: Jong-Hyun Choung, Hwaseong-si (KR); Ji-Young Park, Hwaseong-si (KR); Seon-Il Kim, Seoul (KR); Sang-Gab Kim, Seoul (KR); In-Bae Kim, Asan-si (KR); Jae-Woo Jeong, Incheon (KR)

(73) Assignee: Samsung Display Co., Ltd. (KR)

( * ) Notice: Subject to any disclaimer, the term of this patent is extended or adjusted under 35 U.S.C. 154(b) by 40 days.

(21) Appl. No.: 13/406,388

(22) Filed: Feb. 27, 2012

(65) Prior Publication Data

US 2012/0318769 A1 Dec. 20, 2012

(30) Foreign Application Priority Data

Jun. 15, 2011 (KR) .................. 10-2011-0057937

(51) Int. Cl.
*H01L 21/302* (2006.01)
(52) U.S. Cl.
USPC .................. 438/754; 216/13; 216/41; 216/83; 216/95; 216/100; 216/105; 438/689; 438/745

(58) Field of Classification Search
None
See application file for complete search history.

(56) References Cited

U.S. PATENT DOCUMENTS

| | | | |
|---|---|---|---|
| 2008/0224092 A1* | 9/2008 | Choung et al. .............. | 252/79.3 |
| 2010/0291722 A1* | 11/2010 | Kim et al. ...................... | 438/38 |
| 2011/0079776 A1* | 4/2011 | Choi et al. ..................... | 257/43 |

* cited by examiner

*Primary Examiner* — Lan Vinh
*Assistant Examiner* — Jiong-Ping Lu
(74) *Attorney, Agent, or Firm* — Innovation Counsel LLP

(57) ABSTRACT

A method of forming a metal pattern on a display substrate includes blanket depositing a copper-based layer having a thickness between about 1,500 Å and about 5,500 Å on a base substrate, and forming a patterned photoresist layer on the copper-based layer. The copper-based layer is over-etched by an etching composition containing an oxidizing moderating agent where the over-etch factor is between about 40% and about 200% while using the patterned photoresist layer as an etch stopping layer, and where the etching composition includes ammonium persulfate between about 0.1% by weight and about 50% by weight, includes an azole-based compound between about 0.01% by weight and about 5% by weight and a remainder of water. Thus, reliability of the metal pattern and that of manufacturing a display substrate may be improved.

42 Claims, 5 Drawing Sheets

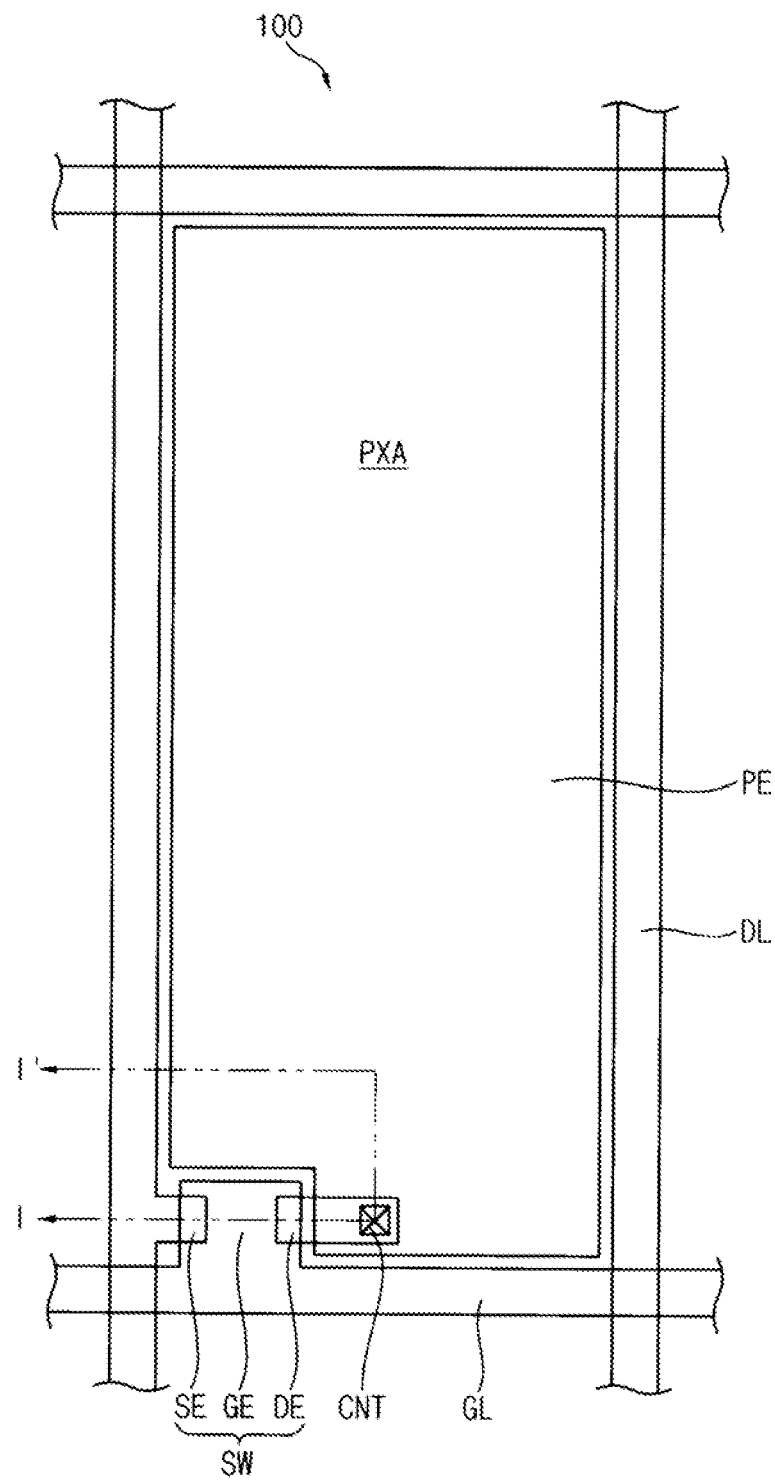

METHOD OF FORMING A METAL PATTERN AND METHOD OF MANUFACTURING A DISPLAY SUBSTRATE INCLUDING THE METAL PATTERN

PRIORITY STATEMENT

This application claims priority under 35 U.S.C. §119 to Korean Patent Application No. 2011-0057937, filed on Jun. 15, 2011 in the Korean Intellectual Property Office (KIPO), the contents of which application are herein incorporated by reference in their entirety.

BACKGROUND

1. Field of the Disclosure

The present disclosure of invention relates to a method of forming a metal pattern on a display substrate and a method of manufacturing a display substrate including the metal pattern. More particularly, example embodiments in accordance with the present disclosure of invention relate to a method of forming a metal pattern for improving an etching margin and a method of manufacturing a display substrate including such margin tolerant metal pattern.

2. Description of Related Technology

Generally, a display substrate used for display devices such as Liquid Crystal Displays (LCD's) includes a plurality of thin-film transistors ("TFT") integrally formed on the substrate as switching elements for driving respective pixel regions. The display substrate also typically includes one or more signal lines connected to each of the TFTs and pixel electrodes that are selectively charged and discharged according to data and gate signals supplied over the signal lines. More specifically, the signal lines may include a gate line that is provided for transmitting a gate driving signal to a gate electrode of a respective TFT, and a data line that extends to cross with the gate line and to transmit a data driving signal to a source electrode of a respective TFT.

As a size of the display device is increased and as desires by customers for higher resolutions (e.g., more pixels per unit length in the gate line longitudinal direction) increase, relative lengths of the gate lines and/or of the data lines tend to increase while comparative widths (relative to lower resolution panels) of the gate lines and/or the data lines tend to decrease. As a result, electric resistances of such signal lines disadvantageously tend to increase. Also as a result, corresponding signal conveying time constants, or resistance-capacitance factors ("RC" factors) of the signal lines disadvantageously tend to increase where increased RC factors lead to increased signal delays and slower display response times. One answer to the problem has been to use relatively low resistance, but also relatively difficult to etch and thus expensive metals for forming the gate lines and/or the data lines where the relatively low resistivities of such metals help to solve the RC signal delay problem.

More specifically, copper (Cu) is sometimes used as the metal having a relatively low resistivity for forming the gate lines or the data lines. On one hand, copper has excellent electric conductivity and is abundantly available as a natural resource; albeit sometimes at higher costs than competing other metals. In addition, copper has a resistance much lower than aluminum or chrome (examples of competing other metals). On the other hand, when it comes to lithographically patterning a metal layer, the resistance of copper to being etched by a respective oxidizing agent is higher than that of aluminum or chrome so that a strong oxidizing agent and/or longer etch times are required for etching a copper-based layer of equal thickness during lithographic patterning of a metal layer containing copper.

Although there is available a copper etchant including the strong oxidizing agent for effectively etching the copper-based layer, patterns of other materials which have already been formed and patterned on the substrate before the patterning of the copper-based layer may be easily damaged in the etching of the copper-based layer by the strong oxidizing agent. Also, when the copper etchant includes the strong oxidizing agent by itself, an etch rate of the copper-based layer is hard to control and in the attempt to save underlying and pre-patterned layers, the copper-based layer may be under-etched. Thus, the copper-based layer may be etched to have a shape different from the shape which is theoretically called for by the circuit design and display performance may suffer.

It is to be understood that this background of the technology section is intended to provide useful background for understanding the here disclosed technology and as such, the technology background section may include ideas, concepts or recognitions (e.g., that of a moderated version of the strong oxidizing agent) that were not part of what was known or appreciated by those skilled in the pertinent art prior to corresponding invention dates of subject matter disclosed herein.

SUMMARY

Example embodiments in accordance with the present disclosure provide a method of forming a metal pattern having a stable profile where the method includes over-etching a copper-based layer by using a selectively moderated etching composition whose moderating agent helps to minimize a damage of other patterns formed under the copper-based layer.

Example embodiments of the present disclosure also provide a method of manufacturing a display substrate including using the method of forming the metal pattern.

According to an example embodiment, a method of forming a metal pattern is provided. In the method, a copper-based layer having a thickness between about 1,500 Å and about 5,500 Å is formed on a base substrate, and a patterned photoresist layer is formed on top of the copper-based layer. The copper-based layer is over-etched by a factor of between about 40% and about 200%, using the patterned photoresist layer as an etch stopping layer and using an etching composition including as an oxidizing agent thereof, ammonium persulfate between about 0.1% by weight and about 50% by weight, as a selective oxidation moderating agent thereof, an azole-based compound between about 0.01% by weight and about 5% by weight and a remainder of water, to form a metal pattern.

In an embodiment, examples of a material that may be used for the azole-based compound may include benzotriazole, aminotetrazole, imidazole or pyrazole.

In an embodiment, the copper-based layer may be etched for between about 30 seconds and about 70 seconds.

In an embodiment, the copper-based layer may be over-etched by between about 100% and about 200% when a thickness of the copper-based layer is between about 1,500 Å and about 2,500 Å. Then, the copper-based layer may be etched for between about 31 seconds and about 46 seconds. In addition, a skew length (undercut distance) between an edge portion of the patterned photoresist layer and an edge portion of the metal pattern may be between about 0.31 μm and about 0.50 μm.

In an embodiment, the copper-based layer may be over-etched by between about 60% and about 120% when a thickness of the copper-based layer is between about 2,500 Å and about 3,500 Å. Then, the copper-based layer may be etched for between about 35 seconds and about 51 seconds. In addition, a skew length between an edge portion of the patterned photoresist layer and an edge portion of the metal pattern may be between about 0.38 μm and about 0.56 μm.

In an embodiment, the copper-based layer may be over-etched by between about 50% and about 100% when a thickness of the copper-based layer is between about 3,500 Å and about 4,500 Å. Then, the copper-based layer may be etched for between about 40 seconds and about 61 seconds. In addition, a skew length between an edge portion of the patterned photoresist layer and an edge portion of the metal pattern may be between about 0.5 μm and about 0.7 μm.

In an embodiment, the copper-based layer may be over-etched by between about 20% and about 80% when a thickness of the copper-based layer is between about 4,500 Å and about 5,500 Å. Then, the copper-based layer may be etched for between about 46 seconds and about 69 seconds. In addition, a skew length (undercut distance) between an edge portion of the patterned photoresist layer and an edge portion of the metal pattern may be between about 0.6 μm and about 0.8 μm.

In an embodiment, the copper-based layer may be over-etched at a temperature between about 25° C. and about 33° C.

In an embodiment, a sidewall surface of the metal pattern may be inclined with respect to a surface of the base substrate by between about 40° and about 70°.

According to an example embodiment, a method of manufacturing a display substrate is provided. In the method, a copper-based layer having a thickness between about 1,500 Å and about 5,500 Å is formed on a base substrate, and a patterned photoresist layer is formed on the copper-based layer. The copper-based layer is etched using the patterned photoresist layer as an etch stopping layer and using an etching composition including ammonium persulfate between about 0.1% by weight and about 50% by weight, an azole-based compound between about 0.01% by weight and about 5% by weight and a remainder of water for between about 30 seconds and about 70 seconds, to form a metal pattern.

In an embodiment, the copper-based layer may be etched for between about 31 seconds and about 46 seconds when a thickness of the copper-based layer is between about 1,500 Å and about 2,500 Å.

In an embodiment, the copper-based layer may be etched for between about 37 seconds and about 51 seconds when a thickness of the copper-based layer is between about 2,500 Å and about 3,500 Å.

In an embodiment, the copper-based layer may be etched for between about 40 seconds and about 61 seconds when a thickness of the copper-based layer is between about 3,500 Å and about 4,500 Å.

In an embodiment, the copper-based layer may be etched for between about 46 seconds and about 69 seconds when a thickness of the copper-based layer is between about 4,500 Å and about 5,500 Å.

According to an example embodiment, a method of manufacturing a display substrate is provided. In the method, a first metal layer including copper and having a thickness between about 1,500 Å and about 5,500 Å is formed on a base substrate. The first metal layer is over-etched by between about 40% and about 200%, using a first patterned photoresist layer as an etch stopping layer formed on the first metal layer and using an etching composition including ammonium persulfate between about 0.1% by weight and about 50% bye weight, an azole-based compound between about 0.01% by weight and about 5% by weight and a remainder of water, to form a first metal pattern including a first signal line. A second metal pattern including a second signal line crossing the first signal line is formed on, and a pixel electrode is formed on the base substrate on which the first and second signal lines are formed.

In an embodiment, after a second metal layer including copper and having a thickness between about 1,500 Å and about 5,500 Å may be formed on the base substrate, the second metal layer may be over-etched by between about 20% and about 150% using the etching composition, to form an input electrode of a thin-film transistor connected to the second signal and an output electrode of the thin-film transistor spaced apart from the input electrode. Thus, the second metal pattern may be formed.

In an embodiment, a second metal layer including copper and having a thickness between about 1,500 Å and about 5,500 Å may be formed on the base substrate. The second metal layer may be over-etched using the etching composition for between about 30 seconds and about 45 seconds, to form an input electrode of a thin-film transistor connected to the second signal and an output electrode of the thin-film transistor spaced apart from the input electrode. Thus, the second metal pattern may be formed.

In an embodiment, a second metal layer including copper and having a thickness between about 1,500 Å and about 5,500 Å may be formed on the base substrate. A second patterned photoresist layer may be formed on the base substrate on which the second metal layer is formed, and the second patterned photoresist layer may include a first thickness portion and a second thickness portion thinner than the first thickness portion. Then, the second metal layer may be over-etched by between about 80% and about 420%, using the second patterned photoresist layer as an etch stopping layer and using the etching composition, to form the second signal line and an electrode pattern connected to the second signal line. An etch-back may be performed for the second patterned photoresist layer to form a remaining pattern, and the second thickness portion may be removed from the second patterned photoresist layer to form the remaining pattern. The electrode pattern may be over-etched by between about 20% and about 150%, using the remaining pattern as an etch stopping layer and using the etching composition, to form an input electrode of a thin-film transistor connected to the second signal line and an output electrode of the thin-film transistor spaced apart from the input electrode. Thus, the second metal pattern may be formed.

In an embodiment, a second metal layer including copper and having a thickness between about 1,500 Å and about 5,500 Å may be formed on the base substrate. A second patterned photoresist layer may be formed on the base substrate on which the second metal layer is formed, and the second patterned photoresist layer may include a first thickness portion and a second thickness portion thinner than the first thickness portion. The second metal layer may be over-etched using the second patterned photoresist layer as an etch stopping layer and using the etching composition for between about 65 seconds and about 80 seconds, to form the second signal line and an electrode pattern connected to the second signal line. An etch-back may be performed for the second patterned photoresist layer to form a remaining pattern, the second thickness portion being removed from the second patterned photoresist layer to form the remaining pattern. The electrode pattern may be over-etched using the remaining pattern as an etch stopping layer and using the etching composition for between about 30 seconds and about 50 seconds, to form an input electrode of a thin-film transistor connected to the second signal line and an output electrode of the thin-film transistor spaced apart from the input electrode. Thus, the second metal pattern may be formed.

In an embodiment, the first metal layer may be over-etched for between about 30 seconds and about 70 seconds.

According to an example embodiment, a method of manufacturing a display substrate is provided. In the method, a first metal layer including copper and having a thickness between about 1,500 Å and about 5,500 Å is formed on a base substrate. The first metal layer is etched using a first patterned photoresist layer formed on the first metal layer as an etch stopping layer and using an etching composition including ammonium persulfate between about 0.1% by weight and about 50% by weight, an azole-based compound between about 0.01% by weight and about 5% by weight and a remainder of water for between about 30 seconds and about 70 seconds, to form a first metal pattern including a first signal line. A second metal pattern including a second signal line crossing the first signal line is formed and a pixel electrode is formed on the base substrate on which the first and second signal lines are formed.

According to the present disclosure, an etching composition including ammonium persulfate ($(NH_4)_2S_2O_8$) as an oxidizing agent thereof and an azole-based compound as a selective reaction moderating agent thereof is used to prevent patterns formed under the copper-based layer from being damaged without substantially decreasing an etch rate of the copper-based layer. In addition, the copper-based layer may be patterned, to have a stable profile. Therefore, a margin of an etching process and a reliability of patterning the copper-based layer may be improved, and thus a reliability of manufacturing a metal pattern and a display substrate may be improved.

BRIEF DESCRIPTION OF THE DRAWINGS

The above and other features and advantages of the present disclosure of invention will become more apparent by describing in detailed example embodiments thereof with reference to the accompanying drawings, in which:

FIG. 1A is a plan view illustrating a display substrate manufactured according to an example manufacturing process of the present disclosure;

DETAILED DESCRIPTION

Figure 1B:
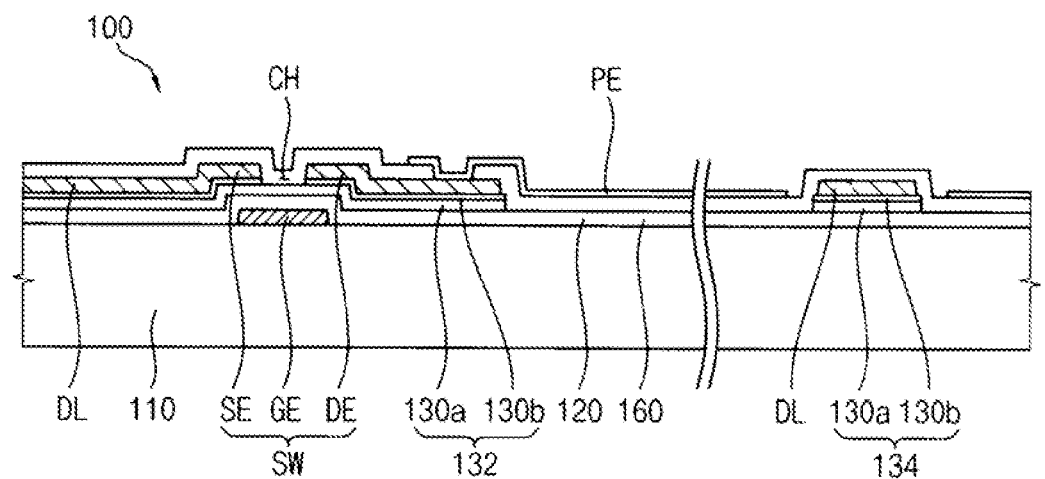
FIG. 1B is a cross-sectional view taken along a line I-I' of FIG. 1.

Method of Forming a Copper-Based Metal Pattern

In accordance with one aspect of the present disclosure, a method of forming a metal pattern, the method includes (a) forming a copper-based metal layer having a predetermined thickness between about 1,500 Å and about 5,500 Å on a base substrate, (b) forming a patterned photoresist layer above the copper-based metal layer, and (c) over-etching through the thickness of the un-patterned copper-based metal layer by an over-etch factor of between about 40% to about 200% using the patterned photoresist layer as an etch stopping layer and using an etching composition including ammonium persulfate between about 0.1% by weight to about 50% by weight, an azole-based compound between about 0.01% by weight to about 5% by weight and a remainder of water, to form a metal pattern.

According to a specific exemplary embodiment, the copper-based metal layer is essentially a copper-based layer that is formed on a base substrate layer of the display substrate and that un-patterned copper-based layer is patterned using a wet etching composition including ammonium persulfate of between about 0.1% by weight and about 50% by weight, an azole-based compound of between about 0.01% by weight and about 5% by weight and a remainder of water to thereby form the predefined metal pattern.

More specifically, the copper-based layer is a layer essentially consisting of copper as its conductive metal of relatively low resistance and this copper-based layer is blanket formed on an entire surface of the base substrate as an initially un-patterned metal layer. A thickness of the copper-based layer may be between about 1,500 Å and about 5,500 Å. It has been found that when the thickness of the copper-based layer is less than about 1,500 Å, a resistance of a signal line formed from this layer tends to be unacceptably decreased although the low resistance copper-based metal is used. Although in theory a line width of such a too-thin of a signal line may be increased in order to counter compensate for the increase of resistance of the signal line due to thickness reduction, the widening of the signal line leads to a decrease of an aperture factor (one that dictates how much light controlling area there is per pixel) of the display apparatus and this disadvantageously leads to reduced image brightness. Therefore, reducing the thickness of the copper-based metal layer below about 1,500 Å is not advisable. In addition, when the thickness of the copper-based layer is less than about 1,500 Å, an etching rate consistency about all areas of the blanket-deposited copper-based layer is difficult to be controlled by the etching composition. However, when the thickness of the copper-based layer is larger than about 5,500 Å, this leads to a highly non-planar structure after the copper-based layer is etched (over-etched) and then further patterns which overlap with the highly nonplanar, patterned metal pattern may be partially broken by the height differences created in he metal pattern. In addition, when the thickness of the copper-based layer is larger than about 5,500 Å, an etching time of the copper-based layer is excessively increased so that an entire pattern-perfecting time for the metal layer may be increased. Thus, the etching composition is preferably used in etching the copper-based layer having the thickness between about 1,500 Å and about 5,500 Å.

A patterned photoresist layer is formed on the base substrate on which the blanket-deposited copper-based layer is formed. The copper-based layer is then etched using the patterned photoresist layer as an etch stopping layer and using the etching composition. The copper-based layer is etched at a temperature in a range between about 25° C. to about 33° C. by the etching composition. For example, the copper-based layer may be etched at a temperature in a range between about 26° C. to about 30° C.

In the etching composition, ammonium persulfate is a main element for selectively etching the copper. In other words, the ammonium persulfate functions as an oxidizer to etch the copper-based layer. When an amount of ammonium persulfate is less than about 0.1% by weight with respect to a total weight of the etching composition, the copper-based layer may not be etched at a noticeable rate. On the other hand, when the amount of ammonium persulfate is larger than about 50% by weight, a reaction rate (K) between the ammonium persulfate and the copper-based layer may be too high and the etching may not be well controlled. Thus, the amount of ammonium persulfate should be between about 0.1% by weight and about 50% by weight with respect to the total weight of the etching composition. For example, the etching composition may be chemically stabilized in a range between about 1% by weight to about 10% by weight of ammonium persulfate.

The azole-based compound portion of the etching composition (etching solution) includes a pentagonal hetero ring containing a nitrogen atom and at least one atom different from carbon. The azole-based compound functions as a reaction rate moderator and thus controls an oxidation rate of the ammonium persulfate to increase a selective etching rate for the copper-based layer. For example, when a titanium layer is formed under the copper-based layer, the titanium layer is easily oxidized compared to the copper-based layer so that the titanium layer is deteriorated and damaged when the etching composition etches both the copper-based layer and the titanium layer. However, the azole-based compound may be selected to prevent the titanium layer from being overly damaged by the etching compound because the azole-based compound increases the selectively of the oxidizing agent for copper as opposed to other metals. Examples of the azole-based compound as may be useful for limiting damage to an underlying titanium layer or the like may include benzotriazole, aminotetrazole, imidazole, pyrazole, etc. These may be used alone or in combinations with one another.

When an amount of the azole-based compound is less than about 0.01% by weight based on the total weight of the etching composition, the azole-based compound may not be present in sufficient concentration to control the selective etching rate of ammonium persulfate relative to copper. When the amount of the azole-based compound is greater than about 5% by weight, etching of the copper-based layer may be disadvantageously inhibited (slowed down) by the azole-based compound; in other words, overly moderated albeit selectively. Thus, the amount of the azole-based compound should be between about 0.01% by weight and about 5% by weight based on the total weight of the etching composition. For example, the amount of the azole-based compound may be between about 0.1% by weight and about 0.7% by weight.

The etching composition may further include a fluoride compound including a fluoride and an oxidizing controller with ammonium persulfate and the azole-based compound. When the etching composition further includes the fluoride compound and the oxidizing controller, the amounts of ammonium persulfate and the azole-based compound are not changed and an amount of water is relatively decreased.

The fluoride compound serves as an oxidizing supporter of the etching composition, is used to increase the selective etching rate of the azole-moderated composition with respect to the copper-based layer. Examples of the fluoride compound may include hydrofluoric acid, ammonium fluoride, ammonium bifluoride, potassium fluoride, sodium fluoride, etc. These may be used alone or in combinations with one another. When an amount of the fluoride compound is less than about 0.01% by weight, the fluoride compound may not serve as the oxidizing supporter. When the amount of the fluoride compound is larger than about 10% by weight, the etching rate of the etching composition may be disadvantageously decreased by the fluoride compound. Thus, the amount of the fluoride compound should be between about 0.01% by weight and about 10% by weight based on the total weight of the etching composition. For example, the amount of the fluoride compound may be between about 0.2% by weight and about 0.7% by weight.

The oxidizing controller may include a nitrate compound including nitric acid and/or a nitrate, a sulfate compound including sulfuric acid and/or sulfates, a phosphate compound including phosphoric acid and/or phosphates, an acetate compound including acetic acid and/or acetates, etc.

These may be used alone or in a combinations with one another. Examples of the nitrate compound may include nitric acid, iron nitrate (III) ($Fe(NO_3)_3$), potassium nitrate, ammonium nitrate, lithium nitrate, etc. Examples of the sulfate compound may include sulfuric acid, ammonium hydrogen sulfate ($NH_4HSO_4$), potassium hydrogen sulfate ($KHSO_4$), dipotassium sulfate ($K_2SO_4$), etc. Examples of the phosphate compound may include phosphoric acid, triammonium phosphate (($NH_4)_3PO_4$), diammonium hydrogen phosphate (($NH_4)_2HPO_4$), ammonium dihydrogen phosphate ($NH_4H_2PO_4$), tripotassium phosphate ($K_3PO_4$), dipotassium hydrogen phosphate ($K_2HPO_4$), potassium dihydrogen phosphate ($KH_2PO_4$), trisodium phosphate ($Na_3PO_4$), disodium hydrogen phosphate ($Na_2HPO_4$), sodium dihydrogen phosphate ($NaH_2PO_4$), etc. Examples of the acetate compound may include acetic acid, ammonium acetate, potassium acetate, sodium acetate, iminodiacetic acid ($HN(CH_2COOH)_2$, IDA), etc. When an amount of each of the nitrate compound, the sulfate compound, the phosphate compound and the acetate compound is larger than about 10% by weight, the oxidizing controller may excessively inhibit the etching rate of the etching composition. Thus, the amount of each of the nitrate compound, the sulfate compound, the phosphate compound and the acetate compound as the oxidizing controller should be less than about 10% by weight based on the total weight of the etching composition.

When the copper-based layer entirely formed (blanket deposited) on the base substrate is etched by the etching composition, the copper-based layer is preferably over-etched beyond an etching end point of the copper-based layer to form the metal pattern. In one embodiment, the etching end point is defined in terms of exposure time for a predetermined etching composition to remove the copper-based layer which is not covered by an etch stopping layer, for example, a photoresist pattern formed on the copper-based layer. After the copper-based layer is etched until a time substantially the same as the etching end point, some of the copper-based layer may nonetheless partially remain in regions other than regions in which the patterned metal pattern was intended to be formed, although the copper-based layer which is not covered by the etch stopping layer, is removed in almost regions by the etching composition. In order to prevent amounts of the copper-based layer from so remaining, the copper-based layer is etched for a longer time duration than the etching end point, which means that the copper-based layer is thereby over-etched. Hereinafter, a factor of over-etching the copper-based layer beyond a predetermined, thickness-based etching end point (be it in terms of etch time and/or etch rate) is referred to as an "over-etching rate". In one embodiment, the etching time determining for etching just up to the thickness-based end point is defined as having an over-etching rate of 0%. Similarly an over-etching rate is defined as being 100% when the total etching time is twice that of a time-based etching end point for a copper-based metal layer of predetermined thickness.

It has been found that when the over-etching rate is less than about 40%, the copper-based layer having a thickness in a range between about 1,500 Å and about 5,500 Å may partially remain in undesired places after finishing an etching process of the copper-based layer. However, when the over-etching rate is larger than about 200%, a pattern-perfecting time for the copper-based metal layer is greatly increased without further advantage and the etching composition may overly-damage the base substrate or the patterns formed under the copper-based layer. Thus, the over-etching rate of the copper-based layer having the thickness in the range between about 1,500 Å and about 5,500 Å is preferably between about 40% and about 200%.

Alternatively, in order to over-etch the copper-based layer, a total etching time of the copper-based layer is controlled to be between about 30 seconds and about 70 seconds. When the copper-based layer having a thickness between about 1,500 Å and about 5,500 Å is etched by the etching composition and the total etching time is less than about 30 seconds, the copper-based layer may remain in undesired locations after finishing the finishing process. However, when the total etching time is larger than about 70 seconds, the pattern-perfecting time is greatly increased without further advantage and the etching composition may overly-damage the base substrate or the patterns formed under the copper-based layer.

For example, when the thickness of the copper-based layer is between about 1,500 Å and about 2,500 Å, the copper-based layer may be over-etched by between about 100% and about 200%. For example, when the thickness of the copper-based layer is about 2,000 Å, the copper-based layer is over-etched by between about 100% and about 200% so that the copper-based layer is entirely etched in regions except for a region in which the patterned photoresist layer is formed. Then, a skew length between an edge portion of the patterned photoresist layer and an edge portion of the metal pattern may be between about 0.31 µm and about 0.50 µm. Alternatively, when the thickness of the copper-based layer is between about 1,500 Å and about 2,500 Å, the copper-based layer is etched for between about 31 seconds and about 46 seconds so that the copper-based layer may be entirely etched in the regions except for the region in which the patterned photoresist layer is intended to be formed.

When the thickness of the copper-based layer is between about 2,500 Å and about 3,500 Å, the copper-based layer may be over-etched by between about 60% and about 120%. For example, when the thickness of the copper-based layer is about 3,000 Å, the copper-based layer is over-etched by between about 60% and about 120% so that the copper-based layer is entirely etched in the regions except for the region in which the patterned photoresist layer is intended to be formed. Then, the skew length (undercut distance) may be between about 0.38 µm and about 0.56 µm. Alternatively, when the thickness of the copper-based layer is between about 2,500 Å and about 3,500 Å, the copper-based layer is etched for between about 37 seconds and about 57 seconds so that the copper-based layer may be entirely etched in the regions except for the region in which the patterned photoresist layer is intended to be formed.

When the thickness of the copper-based layer is between about 3,500 Å and about 4,500 Å, the copper-based layer may be over-etched by a factor of between about 30% and about 100%. For example, when the thickness of the copper-based layer is about 4,000 Å, the copper-based layer is entirely etched in the regions except for the region in which the patterned photoresist layer is intended to be formed. Then, the skew length may be between about 0.5 µm and about 0.7 µm. Alternatively, when the thickness of the copper-based layer is between about 3,500 Å and about 4,500 Å, the copper-based layer is etched for between about 40 seconds and about 61 seconds so that the copper-based layer may be entirely etched in the regions except for the region in which the patterned photoresist layer is intended to be formed.

When the thickness of the copper-based layer is between about 4,500 Å and about 5,500 Å, the copper-based layer may be over-etched by between about 20% and about 80%. For example, when the thickness of the copper-based layer is about 5,000 Å, the copper-based layer is entirely etched in the regions except for the region in which the patterned photoresist layer is intended to be formed. Then, the skew length may be between about 0.6 µm and about 0.8 µm. Alternatively, when the thickness of the copper-based layer is between about 4,500 Å and about 5,500 Å, the copper-based layer is etched for between about 46 seconds and about 69 seconds so that the copper-based layer may be entirely removed in the regions except for the region in which the patterned photoresist layer is intended to be formed.

A taper angle of a sidewall surface of the metal pattern inclined with respect to a surface of the base substrate may be between about 40° and about 70°.

Manufacturing Example

A copper-based layer having a thickness in a range between about 2,500 Å and about 3,500 Å was formed on a glass substrate. After forming a patterned photoresist layer on the copper-based layer, an etching composition including ammonium persulfate between about 0.1% by weight and about 50% by weight, an azole-based compound between about 0.01% by weight and about 5% by weight and a remainder of water was prepared. At a temperature of about 27° C., an etching end portion of the copper-based layer was measured by the etching composition. As a result, the obtained, for-thickness etching end portion was about 23 seconds.

Calculating an Over-Etching Rate

A skew length targeted from the determined etching end point was determined to between about 0.3 µm and about 0.6 µm, and thus an over-etching rate was calculated when an actual skew length is included in a range of the targeted skew length. Thus, obtained results are illustrated in Table 1.

TABLE 1

| | Total etching time | | | | |
|---|---|---|---|---|---|
| | 33 seconds | 37 seconds | 44 seconds | 51 seconds | 58 seconds |
| Skew length | 0.29 µm | 0.38 µm | 0.49 µm | 0.56 µm | 0.74 µm |
| Taper angle | 45° | 66° | 57° | 65° | 67° |
| Over-etching rate | 45% | 60% | 90% | 120% | 150% |

In Table 1, the over-etching rate refers to a percentage of a value deducting a time until the for-thickness etching end point from the total etching time with respect to the etching end point.

Referring to Table 1, when the thickness of the copper-based layer is between about 2,500 Å and about 3,500 Å and the copper-based layer is etched using the etching composition including ammonium persulfate as an oxidizing agent and the azole-based compound as a selectively moderating agent and for the total etching time between about 37 seconds and about 51 seconds, the targeted skew length is formed. Simultaneously, when the over-etching rate is between about 60% and about 120%, the targeted skew length is between 0.3 µm and about 0.6 µm.

Simulation and Results

Based on the results represented by Table 1, it was assumed and simulated (e.g., by way of computer simulation) that samples are formed via substantially the same method as the above-illustrated and are over-etched using copper-based layers having a thickness between about 1,500 Å and about 2,500 Å, between about 3,500 Å and about 4,500 Å, and between about 4,500 Å and about 5,500 Å, thereby obtaining an etching end point and a total etching time. A simulated result for a copper-based layer having a thickness between about 1,500 Å and about 2,500 Å is illustrated in Table 2. In Table 2, the etching end point is about 15 seconds.

TABLE 2

| | Total etching time | | | | |
|---|---|---|---|---|---|
| | 29 seconds | 31 seconds | 38 seconds | 46 seconds | 54 seconds |
| Skew length | 0.17 μm | 0.31 μm | 0.41 μm | 0.50 μm | 0.60 μm |
| Over-etching rate | 90% | 100% | 150% | 200% | 250% |

Referring to Table 2, the copper-based layer having a thickness between about 1,500 Å and about 2,500 Å is proper to be over-etched by between about 100% and about 200%. In addition, the total etching time of the copper-based layer having a thickness between about 1,500 Å and about 2,500 Å is between about 31 seconds and about 46 seconds.

A simulated result for a copper-based layer having a thickness between about 3,500 Å and about 4,500 Å is illustrated in Table 3. In Table 3, the etching end point is about 31 seconds.

TABLE 3

| Total etching time | 46 seconds | 61 seconds | 80 seconds |
|---|---|---|---|
| Skew length | 0.50 μm | 0.70 μm | 0.94 μm |
| Over-etching rate | 50% | 100% | 150% |

Referring to Table 3, the copper-based layer having a thickness between about 3,500 Å and about 4,500 Å is proper to be over-etched by between about 50% and about 100%. In addition, the total etching time of the copper-based layer having a thickness between about 3,500 Å and about 4,500 Å is between about 46 seconds and about 61 seconds.

A simulated result for a copper-based layer having a thickness between about 4,500 Å and about 5,500 Å is illustrated in Table 4. In Table 4, the etching end point is about 38 seconds.

TABLE 4

| Total etching time | 54 seconds | 69 seconds | 81 seconds |
|---|---|---|---|
| Skew length | 0.60 μm | 0.80 μm | 0.95 μm |
| Over-etching rate | 40% | 80% | 110% |

Referring to Table 4, the copper-based layer having a thickness between about 4,500 Å and about 5,500 Å is proper to be over-etched by between about 40% and about 80%. In addition, the total etching time of the copper-based layer having a thickness between about 4,500 Å and about 5,500 Å is between about 54 seconds and about 69 seconds.

According to the above descriptions, the copper-based layer having a thickness between about 1,500 Å and about 5,500 Å is over-etched using an etching composition including ammonium persulfate as a main oxidizer and the azole-based compound between about 40% and about 200% as a selectively moderator relative to copper to thereby entirely remove the copper-based layer in the regions except for the region in which the patterned photoresist layer is intended to be formed and to satisfy the targeted skew length.

Method of Manufacturing a Display Substrate

Hereinafter, a method of manufacturing a display substrate using the method of forming the metal pattern will be described with reference to specific examples and comparative examples.

FIG. 1A is a plan view illustrating a display substrate manufactured according to an example embodiment of the present disclosure, and FIG. 1B is a cross-sectional view taken along a line I-I' of FIG. 1.

Referring to FIGS. 1A and 1B, a display substrate 100 includes a first signal line GL, a second signal line DL, a thin-film transistor SW as its switching element and a pixel electrode PE. The first signal line GL defines a gate line for applying a gate driving signal to a gate electrode of the switching element SW and the second signal line DL defines a data line for applying a data driving signal to a source electrode of the thin-film transistor SW. A drain electrode of the thin-film transistor SW connects to the pixel-electrode PE.

Accordingly, each of the first and second signal lines GL and DL is electrically connected to the thin-film transistor SW, where the latter connects to the pixel electrode PE. A region in which the pixel electrode PE is formed is defined as a light-passing pixel area PXA. The aperture ratio of the device is a function of the light-passing pixel area PXA versus other per-pixel areas that do not pass controlled light through them. The data line DL is typically such a light blocking feature and hence it is undesirable to increase the width of the data line DL while at the same time it is desirable to decrease the resistivity (resistance per unit length) of the data line DL. FIGS. 1A-1B show that the thin-film transistor SW includes a respective control electrode GE, an input or source electrode SE and an output or drain electrode DE. The control electrode GE is connected to the first signal line GL and the input electrode SE is connected to the second signal line DL.

As shown in the cross-sectional view of FIG. 1B, a first metal pattern including the first signal line GL and an integral branch thereof which defines the control electrode GE of the thin-film transistor SW is formed directly on a base substrate 110. A first insulating layer 120 is then formed on top of the first metal pattern.

Later, a second metal pattern including the second signal line DL is formed above the first insulating layer 120. The second metal pattern includes the second signal line DL and an integral branch thereof which defines the input electrode SE of the thin-film transistor SW. The second metal pattern may also include the output electrode DE which is spaced apart (after etching) from the input electrode SE. Also after selective etching, the input electrode SE and the output electrode DE are caused to be partially overlapping with an active (e.g., semiconductive) pattern 132 that is deposited before the second metal pattern is blanket deposited. The gap or channel area between the spaced apart input electrode SE and output electrode DE is overlapped by the earlier patterned control electrode GE, where the first insulating layer 120 functions as a dielectric between the control electrode GE and the active (e.g., semiconductive) pattern 132. The active pattern 132 corresponding to a region between the input electrode SE and the output electrode DE is referred to as a channel CH of the thin-film transistor SW. The active pattern 132 may include a semiconductor layer 130a and an ohmic contact layer 130b stacked as shown. A dummy pattern 134 having a cross-sectional structure substantially the same as the active pattern 132 is formed under the second signal line DL. A second insulating layer 160 is formed on top of the second metal pattern.

The pixel electrode PE is formed on top of the second insulating layer 160 and it makes contact with the output electrode DE thorough a contact hole formed through the second insulating layer 160. Thus, the pixel electrode PE is electrically connected to the thin-film transistor SW where the later is operatively coupled to the first and second signal lines GL and DL.

FIGS. 2 to 7 are cross-sectional views illustrating a method of manufacturing the display substrate shown in FIG. 1B.

Figure 2:
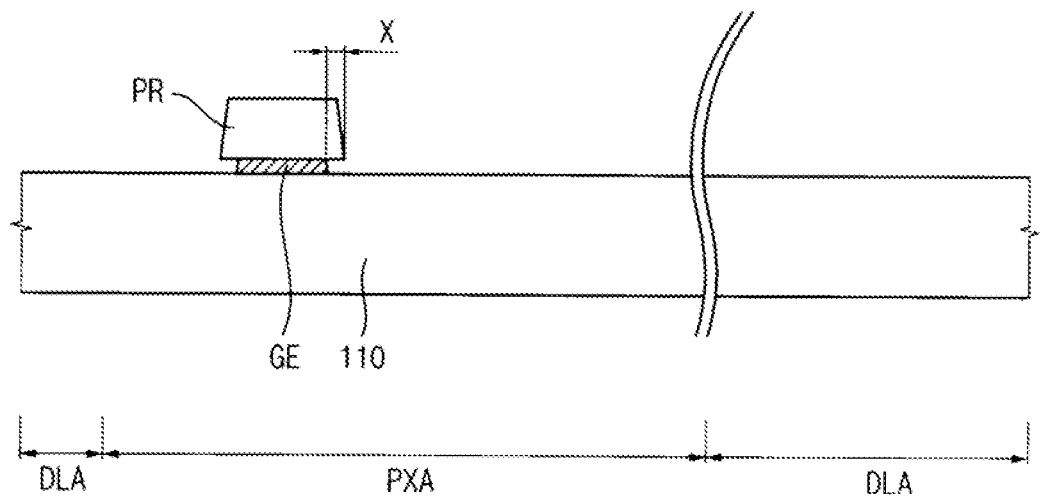
FIGS. 2 to 7 are cross-sectional views illustrating a method of manufacturing the display substrate shown in FIG. 1B.

Referring to FIG. 2, a first metal layer is formed on the base substrate 110, and the first metal layer is patterned to form the first metal pattern. In FIG. 2, although the control electrode GE connected to the first signal line GL of the first metal pattern will be mainly illustrated, the first signal line GL has a cross-sectional structure substantially the same with the control electrode GE except that the first signal line GL extends longitudinally in the horizontal direction as shown in FIG. 1A.

For example, the first metal layer is blanket deposited as a first copper-based layer and then a first patterned photoresist layer PR is formed on top of that first metal layer. The first metal layer of one embodiment includes a copper-based layer where the copper-based layer has a thickness between about 1,500 Å and about 5,500 Å. Although not shown in figures, a metal layer different from the copper-based layer, for example, a titanium layer may be formed between the first metal layer and the base substrate 110. In other words, in one embodiment the first copper-based layer is not directly deposited on the display substrate but instead optionally has at least one different conductive or other material layer blanket deposited beneath it. The optional and underlying layers may be used for improving adhesion and/or serving as migration barriers for preventing migration of copper through them.

The first metal layer is etched using the first patterned photoresist layer PR as an etch stopping layer and using an etching composition including as an oxidizing agent thereof, ammonium persulfate between about 0.1% by weight and about 50% by weight, and including as a reaction rate moderating agent thereof, an azole-based compound between about 0.01% by weight and about 5% by weight and a remainder of water. Then, the first metal layer is over-etched by between about 40% and about 200% using the azole-moderated etching composition. A total etching time of the first metal layer is between about 30 seconds and about 70 seconds. The etching composition is substantially the same as the etching composition previously described above in the method of forming the metal pattern. In addition, an etching process of the first metal layer is substantially the same as the method of forming the metal pattern previously described above. Thus, any repetitive descriptions will be omitted. The first metal layer is etched by the etching composition at a temperature between about 25° C. and about 33° C. When the optional, underlying one or more layers (e.g., titanium or another refractive metal) are included, the azole-based reaction rate moderating agent functions to limit excessive over-etching of the underlying layer because the azole-based reaction rate moderating agent is selected to be least reaction rate-inhibiting with respect to the copper-based first metal layer.

Since the first metal layer is over-etched by between about 40% and about 200%, an etched surface of the control electrode GE in the first metal pattern is relatively depressed (under cut) from a sidewall surface of the first patterned photoresist layer PR. An edge portion of the gate line GL is similarly relatively depressed (under cut) from an edge portion of the first patterned photoresist layer. Therefore, the first metal layer does not remain in regions except for a region in which the first patterned photoresist layer PR is formed. A distance between the edge portion of the first metal layer and the edge portion of the control electrode GE is defined herein as a "skew length" (or alternatively as an undercut distance).

In one embodiment, the skew length (x) may be between about 0.3 μm and about 0.8 μm.

After blanket depositing and then patterning the first metal pattern (which may include the optional Ti or other underlying material layer(s)), the first patterned photoresist layer PR is stripped off.

Figure 3:
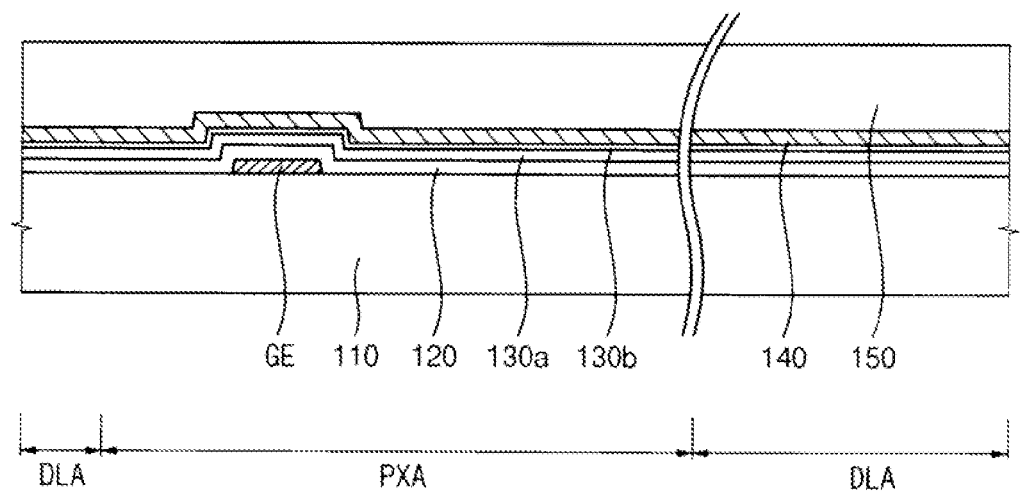

Referring to FIG. 3, the first insulating layer 120, the semi-conductive (e.g., semiconductor) layer 130a, the ohmic contact layer 130b and a second metal layer 140 are sequentially and blanket deposit wise formed in the recited order one above the next and on the base substrate 110 on which the first metal pattern is already formed. Then, a second photoresist layer 150 is blanket deposited on the second metal layer 140.

The second metal layer 140 may include a copper-based layer such as a copper-based layer. The copper-based portion of the second metal layer 140 may have a thickness between about 1,500 Å and about 5,500 Å. Although not shown in figures, a different metal layer (e.g., Ti) from the copper-based layer or other material layer (e.g., TiW, TiN) may be optionally formed between the second metal layer 140 and the ohmic contact layer 130b.

Each of the first insulating layer 120, the semiconductor layer 130a, the ohmic contact layer 130b and the second metal layer 140 is entirely formed (blanket deposited) on the base substrate 110. In addition, the photoresist layer 150 is entirely formed on the base substrate 110.

Hereinafter, referring to FIGS. 4 to 7, processes for patterning the second metal layer 140 to form the second metal pattern including the second signal line DL, the input electrode SE and the output electrode DE and for forming the active pattern 132 will be illustrated in detail.

Figure 4:
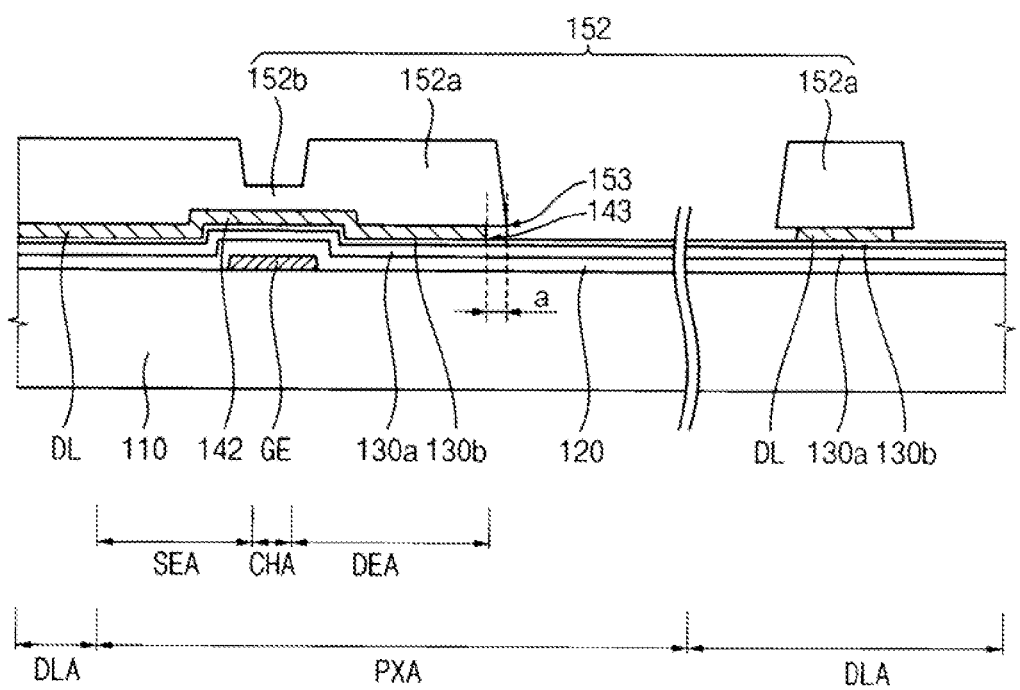

Referring to FIG. 4, the blanket deposited photoresist layer 150 is patterned to thereby form a second patterned photoresist layer 152 including a first thickness portion 152a and a second thickness portion 152b. The second metal layer 140 is patterned using the second patterned photoresist layer 152 to form a corresponding electrode pattern 142 and the second signal line DL. (The source and drain electrodes are later formed out of the electrode pattern 142 with aid of the depressed part 152b of the second patterned photoresist layer 152.)

For example, a photo mask (not shown) is disposed over the base substrate 110 on which the photoresist layer 150 is formed, and the photoresist layer 150 is exposed. After exposing the photoresist layer 150, the photoresist layer 150 is developed to form the second patterned photoresist layer 152 as shown. For example, the mask may include an opening portion, a light-blocking portion and a semi-transmitting portion treating a half-tone or a diffracting portion. The second thickness portion 152b may be formed for example in a region corresponding to the semi-transmitting portion or the diffracting portion (this depending on whether a positive or negative photolithography process is used).

The first thickness portion 152a is formed in regions in which the second metal layer 140 remains after being patterned, for example, a source region SEA, a drain region DEA and a second signal line region DLA, and has a first thickness. For example, the second thickness portion 152b is formed in a channel region CHA between the source and drain regions SEA and DEA, and has a second thickness smaller than the first thickness.

The second metal layer 140 is first etched using the second patterned photoresist layer 152 as an etch stopping layer to form the electrode pattern and the second signal line DL. Although not shown in the cross sectional view of FIG. 4, the electrode pattern 142 (from which the source electrode SE will be formed) is integrally connected to the second signal line DL and is disposed to continuously extend in the source region SEA, the channel region CHA and the drain region DEA. In addition, the electrode pattern 142 overlaps with the control electrode GE on the control electrode GE of the thin-film transistor SW. The second signal line DL is formed in the second signal line region DLA. The etching composition used in the first etching may also be used in patterning the second metal layer 150.

In one embodiment, the second metal layer 140 is over-etched by between about 80% and about 420%. The second metal layer 140 is etched at a temperature between about 25° C. and about 33° C. Over-etching the second metal layer 140 makes a first edge portion 153, which is an outer boundary edge portion of the second patterned photoresist layer 152, protrude beyond an outside and second edge portion 143, which is an edge portion of the electrode pattern 142. In other words, the second metal layer 140 is undercut by the over-etching process. In so over-etching the second metal layer 140, a total etching time for etching the second metal layer 140 may be between about 65 seconds and about 80 seconds. Then, a skew length (undercut distance) between the first and second edge portions 153 and 143 may be between about 0.9 µm and about 1.1 µm. As the second metal layer 140 is over-etched by between about 80% and about 420%, the thin portion of the original, second patterned photoresist layer 152 (Refer to FIG. 4) is also removed and an edge portion of a remaining photoresist pattern 154 (Refer to FIG. 5) coincides with the edge portion of the electrode pattern 142. A relation between the remaining photoresist pattern 154 (FIG. 5) and the electrode pattern 142 will be illustrated in detail by referring to FIG. 5.

When a thickness of the second metal layer 140 is between about 1,500 Å and about 2,500 Å, between about 3,500 Å and about 4,500 Å, and between about 4,500 Å and about 5,500 Å, an over-etching rate and a skew length in first etching the second metal layer 140 is illustrated in Table 5 to Table 8.

TABLE 5

|  | Total etching time | | | |
| --- | --- | --- | --- | --- |
|  | 54 seconds | 69 seconds | 80 seconds | 100 seconds |
| Skew length | 0.69 µm | 0.90 µm | 1.05 µm | 1.32 µm |
| Over-etching rate | 250% | 350% | 420% | 550% |

Referring to Table 5, when the thickness of the second metal layer 140 is between about 1,500 Å and about 2,500 Å, the etching end point of the second metal layer 140 for the etching composition is about 15 seconds. Then, the skew length (a) is about 0.69 µm when the total etching time is about 54 seconds and the over-etching time is about 250%. Further, the skew length (a) is about 0.90 µm when the total etching time is about 69 seconds and the over-etching time is about 350%. Furthermore, the skew length (a) is about 1.05 µm when the over-etching time is about 420%, and the skew length (a) is about 1.32 µm when the over-etching time is about 550%. Therefore, when the thickness of the second metal layer 140 is between about 1,500 Å and about 2,500 Å and a targeted skew length is between about 0.9 µm and about 1.1 µm, the over-etching rate is between about 350% and about 420%.

TABLE 6

|  | Total etching time | | | |
| --- | --- | --- | --- | --- |
|  | 46 seconds | 58 seconds | 69 seconds | 81 seconds |
| Skew length | 0.6 µm | 0.74 µm | 0.86 µm | 1.09 µm |
| Over-etching rate | 100% | 150% | 200% | 250% |

Referring to Table 6, when the thickness of the second metal layer 140 is between about 2,500 Å and about 3,500 Å, the etching end point of the second metal layer 140 for the etching composition is about 23 seconds. Then, the skew length (a) is about 0.6 µm when the total etching time is about 46 seconds and the over-etching time is about 100%. Further, the skew length (a) is about 0.74 µm when the total etching time is about 58 seconds and the over-etching time is about 150%. Furthermore, the skew length (a) is about 0.86 µm when the over-etching time is about 200%, and the skew length (a) is about 1.09 µm when the over-etching time is about 250%. Therefore, when the thickness of the second metal layer 140 is between about 2,500 Å and about 3,500 Å and a targeted skew length is between about 0.9 µm and about 1.1 µm, the over-etching rate is between about 200% and about 250%.

TABLE 7

|  | Total etching time | | | |
| --- | --- | --- | --- | --- |
|  | 52 seconds | 67 seconds | 80 seconds | 92 seconds |
| Skew length | 0.62 µm | 0.88 µm | 1.05 µm | 1.22 µm |
| Over-etching rate | 70% | 120% | 160% | 200% |

Referring to Table 7, when the thickness of the second metal layer 140 is between about 3,500 Å and about 4,500 Å, the etching end point of the second metal layer 140 for the etching composition is about 31 seconds. Then, the skew length (a) is about 0.62 µm when the total etching time is about 52 seconds and the over-etching time is about 70%. Further, the skew length (a) is about 0.88 µm when the total etching time is about 67 seconds and the over-etching time is about 120%. Furthermore, the skew length (a) is about 1.05 µm when the over-etching time is about 160%, and the skew length (a) is about 1.22 µm when the over-etching time is about 200%. Therefore, when the thickness of the second metal layer 140 is between about 3,500 Å and about 4,500 Å and a targeted skew length is between about 0.9 µm and about 1.1 µm, the over-etching rate is between about 120% and about 160%.

TABLE 8

|  | Total etching time | | | |
| --- | --- | --- | --- | --- |
|  | 69 seconds | 81 seconds | 100 seconds | 115 seconds |
| Skew length | 0.90 µm | 1.06 µm | 1.32 µm | 1.54 µm |
| Over-etching rate | 80% | 110% | 160% | 200% |

Referring to Table 8, when the thickness of the second metal layer 140 is between about 4,500 Å and about 5,500 Å, the etching end point of the second metal layer 140 for the etching composition is about 38 seconds. Then, the skew length (a) is about 0.90 µm when the total etching time is about 69 seconds and the over-etching time is about 80%.

Further, the skew length (a) is about 1.06 μm when the total etching time is about 81 seconds and the over-etching time is about 110%. Furthermore, the skew length (a) is about 1.32 μm when the over-etching time is about 160%, and the skew length (a) is about 1.54 μm when the over-etching time is about 200%. Therefore, when the thickness of the second metal layer 140 is between about 4,500 Å and about 5,500 Å and a targeted skew length is between about 0.9 μm and about 1.1 μm, the over-etching rate is between about 80% and about 110%.

Figure 5:
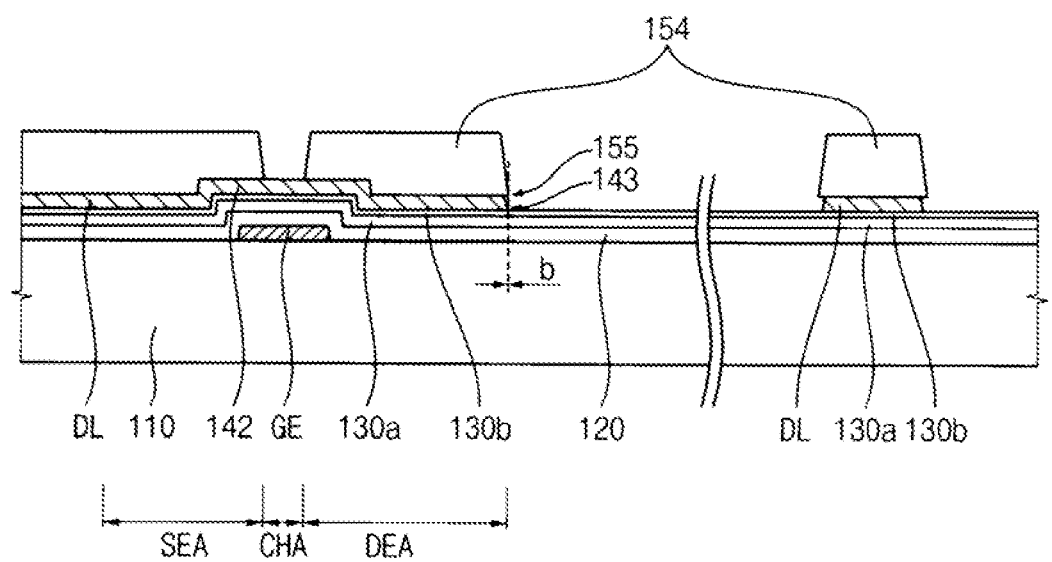

Referring to FIG. 5, the second patterned photoresist layer 152 is formed by an etch-back process to form the remaining pattern 154 removing the second thickness portion 152b. The second patterned photoresist layer 152 is partially removed to be substantially coincided with a third edge portion 155 as the remaining pattern 154 and the second edge portion 143 as the edge portion of the electrode pattern 142. The etch-back process is defined as a process that partially removes the second patterned photoresist layer 152 in upper and lower directions and in right and left directions. By the etch-back process, the first edge portion 153 (FIG. 4) that was relatively protruded from the second edge portion 143 is removed to form the third edge portion 155 (FIG. 5) and to be coincided with the third edge portion 155 and the second edge portion 143. A distance (b) between the second edge portion 143 and the third edge portion 155 may be substantially between about 0 μm and about 1 μm.

In addition, by the etch-back process, the second thickness portion 152b of the second patterned photoresist layer 152 is removed to expose the electrode pattern 142 of the channel region CHA. The first thickness portion 152a (FIG. 4) is removed by the thickness of the second thickness portion 152b in upper and lower directions and in right and left directions to form the remaining pattern 154.

Figure 6:
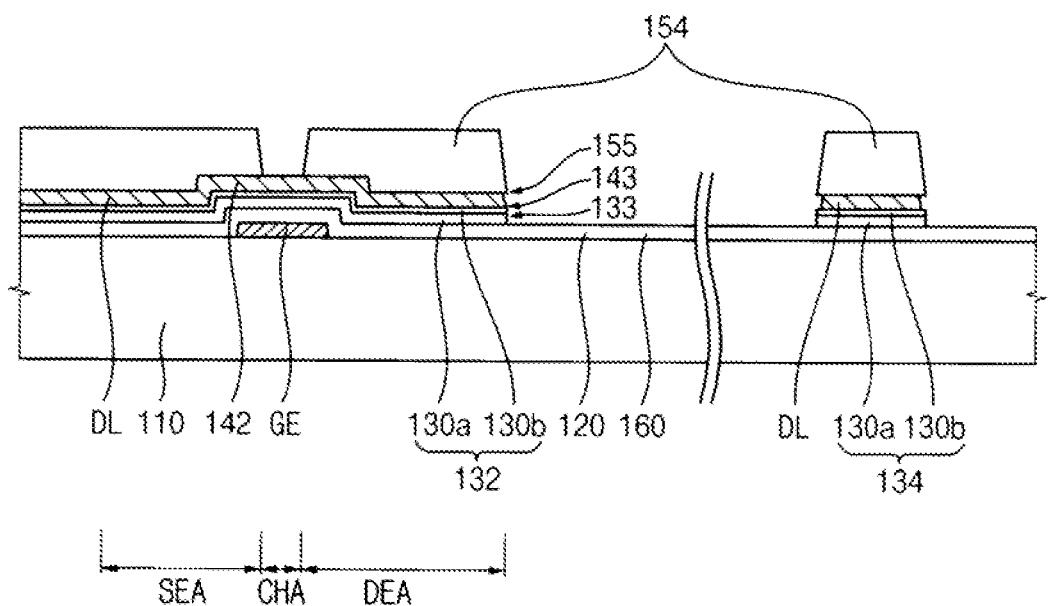

Referring to FIG. 6, the semiconductor layer 130a and the ohmic contact layer 130b are patterned using the remaining pattern 154, the second signal line DL and the electrode pattern 142 as an etch stopping layer. Thus, the active pattern 132 of the thin-film transistor SW is formed and the dummy pattern 134 is formed under the second signal line DL. The semiconductor layer 130a and the ohmic contact layer 130b are patterned by a dry-etch process using an etching gas.

Since the second edge portion 143 is already disposed at an axis substantially the same as the third edge portion 155 and the remaining pattern 154 and the electrode pattern 142 are used as the etch stopping layer in etching the semiconductor layer 130a and the ohmic contact layer 130b, a fourth edge portion 133 as an edge portion of the active pattern 132 may be substantially coincided with the second edge portion 143. Thus, a distance between the second edge portion 143 and the fourth edge portion 133 may be minimized.

Figure 7:
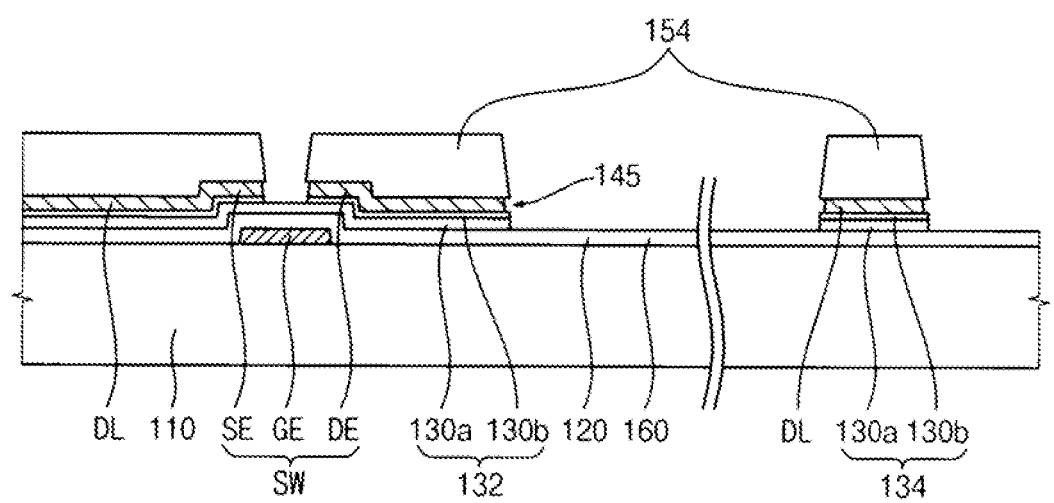

Referring to FIG. 7, the electrode pattern 142 is secondly over-etched by between about 20% and about 150% using the etching composition and using the remaining pattern 154 as an etch stopping layer to thus subdivide the electrode pattern 142 and form the input electrode SE and the spaced apart output electrode DE. In this step, the electrode pattern 142 is etched by the etching composition at a temperature between about 25° C. and about 33° C.

For example, the electrode pattern 142 in the channel region CHA is removed to form the input electrode SE connected to the second signal line DL and the output electrode DE spaced apart from the input electrode SE. By the etching composition, the second edge portion 143 is removed, and a fifth edge portion 145 of each of the input electrode SE and the output electrode DE is formed. Since the electrode pattern 142 is over-etched by the etching composition in this step, the fifth edge portion 145 is relatively depressed, compared to the third edge portion 155 or the fourth edge portion 133. The electrode pattern 142 is over-etched by between about 20% and about 150% to entirely removing the electrode pattern 142 in the channel region CHA. In this second etching of the electrode pattern 142, the electrode pattern 142 is over-etched in a minimum range capable of preventing the remaining pattern 142 from extending into the channel region CHA, so that a distance between the fourth edge portion 133 and the fifth edge portion 145, i.e. a skew length is less than about 0.7 μm. Since the second metal layer 140 is over-etched by between about 80% and about 420% in first etching the second metal layer 140 to be already coincided with the edge portion of the remaining pattern 154 and the edge portion of the electrode pattern 142, the distance between the fourth and fifth edge portions 133 and 145 may be minimized although the electrode pattern 142 is over-etched in the minimum range.

When a thickness of the electrode pattern 142 is between about 1,500 Å and about 2,500 Å, between about 3,500 Å and about 4,500 Å, and between about 4,500 Å and about 5,500 Å, an over-etching rate and a protruded length in secondly etching the electrode pattern 142 is illustrated in Table 9 to Table 12.

TABLE 9

| | Total etching time | | | |
|---|---|---|---|---|
| | 29 seconds | 34 seconds | 38 seconds | 43 seconds |
| Protruded length | 0.17 μm | 0.32 μm | 0.47 μm | 0.61 μm |
| Over-etching rate | 90% | 120% | 150% | 180% |

Referring to Table 9, in secondly etching the electrode pattern 142, when the thickness of the electrode pattern 142 is between about 1,500 Å and about 2,500 Å, the etching end point of the electrode pattern 142 for the etching composition is about 15 seconds. Then, the protruded length between the fourth edge portion 133 and fifth edge portion 145 is about 0.17 μm when the total etching time is about 29 seconds and the over-etching time is about 90%. Further, the protruded length is about 0.32 μm when the total etching time is about 34 seconds and the over-etching time is about 120%. Furthermore, the protruded length is about 0.47 μm when the over-etching time is about 150%, and the protruded length is about 0.61 μm when the over-etching time is about 180%. Therefore, when the thickness of the electrode pattern 142 is between about 1,500 Å and about 2,500 Å and a targeted protruded length is equal to or less than about 0.5 μm, the over-etching rate of the electrode pattern 142 is between about 120% and about 150%. When the over-etching rate is about 90%, the electrode pattern 142 may be remained in a region which is not cover by the remaining pattern 154 although the protruded length may minimized to be not preferable.

TABLE 10

| | Total etching time | | | |
|---|---|---|---|---|
| | 33 seconds | 37 seconds | 40 seconds | 44 seconds |
| Protruded length | 0.29 μm | 0.43 μm | 0.53 μm | 0.63 μm |
| Over-etching rate | 45% | 60% | 75% | 90% |

Referring to Table 10, when the thickness of the electrode pattern 142 is between about 2,500 Å and about 3,500 Å, the etching end point of the electrode pattern 142 for the etching composition is about 23 seconds. Then, the protruded length is about 0.29 μm when the total etching time is about 33 seconds and the over-etching time is about 45%. Further, the protruded length is about 0.43 μm when the total etching time is about 37 seconds and the over-etching time is about 60%. Furthermore, the protruded length is about 0.53 μm when the over-etching time is about 75%, and the protruded length (a) is about 0.63 μm when the over-etching time is about 90%. Therefore, when the thickness of the electrode pattern 142 is between about 2,500 Å and about 3,500 Å and a targeted protruded length is equal to or less than about 0.5 μm, the over-etching rate of the electrode pattern 142 is between about 60% and about 75%. When the over-etching rate is about 45%, the electrode pattern 142 may be remained in a region which is not cover by the remaining pattern 154 although the protruded length may minimized.

TABLE 11

|  | Total etching time | | | |
| --- | --- | --- | --- | --- |
|  | 37 seconds | 40 seconds | 43 seconds | 46 seconds |
| Protruded length | 0.42 μm | 0.51 μm | 0.61 μm | 0.71 μm |
| Over-etching rate | 20% | 30% | 40% | 50% |

Referring to Table 11, when the thickness of the electrode pattern 142 is between about 3,500 Å and about 4,500 Å, the etching end point of the electrode pattern 142 for the etching composition is about 31 seconds. Then, the protruded length is about 0.51 μm when the total etching time is about 40 seconds and the over-etching time is about 30%. Further, the protruded length is about 0.61 μm when the total etching time is about 40 seconds and the over-etching time is about 40%. Therefore, when the thickness of the electrode pattern 142 is between about 3,500 Å and about 4,500 Å and a targeted protruded length is equal to or less than about 0.65 μm, the over-etching rate of the electrode pattern 142 is between about 30% and about 40%.

TABLE 12

|  | Total etching time | | | |
| --- | --- | --- | --- | --- |
|  | 46 seconds | 50 seconds | 54 seconds | 58 seconds |
| Protruded length | 0.71 μm | 0.84 μm | 0.96 μm | 1.09 μm |
| Over-etching rate | 20% | 30% | 40% | 50% |

Referring to Table 12, when the thickness of the electrode pattern 142 is between about 4,500 Å and about 5,500 Å, the etching end point of the electrode pattern 142 for the etching composition is about 38 seconds. Then, the protruded length is about 0.71 μm when the total etching time is about 46 seconds and the over-etching time is about 20%. Therefore, when the thickness of the electrode pattern 142 is between about 4,500 Å and about 5,500 Å and a targeted protruded length is equal to or less than about 0.7 μm, the over-etching rate of the electrode pattern 142 is about 20%.

The ohmic contact layer 130b in the channel region CHA is removed using the input electrode SE and the output electrode DE as an etch stopping layer (self-aligning mask) to thus form a channel portion of the thin-film transistor SW.

Referring to FIGS. 1B and 7, the second insulating layer 160 is formed on the base substrate 110 on which the thin-film transistor SW. Although not shown in the figures, a planarizing layer (e.g., organic material) or a color layer may be formed on the second insulating layer 160 in some embodiments. The contact hole CNT is then formed through the second insulating layer 160 and the pixel electrode PE making contact with the output electrode DE through the contact hole is formed.

Alternatively, a copper-based layer may be patterned using the etching composition including ammonium persulfate and the azole-based compound in a method of manufacturing a display substrate having a top-gate structure including a first metal pattern formed by the first metal layer and a second metal pattern formed by the second metal layer. Then, the first metal pattern may include the second signal line DL, the input electrode SE and the output electrode DE, and the second metal pattern may include the first signal line GL and the control electrode GE.

In addition, the second metal pattern may be formed using different mask from a mask used in forming the active pattern 132. After the semiconductor layer 130a and the ohmic contact layer 130b are patterned using a first mask to form the active pattern 132, the second metal layer 140 may be formed on the base substrate 110 on which the active pattern 132 is formed and the second metal layer 140 is patterned using a second mask different from the first mask to form the second metal pattern. Then, the second metal pattern may be formed via substantially the same processes with etching the first metal layer. For example, the second metal layer may be over-etched by between about 20% and about 150 to form the second metal pattern. A total etching time of the second metal layer may be between about 30 seconds and about 45 seconds. Since the first and second masks are different from each other, the dummy pattern 134 shown in FIG. 1B may not be formed when the first and second masks are used.

According to the above, an etching composition including ammonium persulfate $((NH_4)_2S_2O_8)$ as an oxidizing agent and an azole-based compound as a selective reaction rate slowing agent is used to reduce or prevent the oxidizing agent alone from damaging patterns formed under the copper-based layer without substantially decreasing the effective etch rate of the composition through the copper-based layer. In addition, the copper-based layer may be patterned, to have a stable profile. Therefore, a margin of an etching process and a reliability of patterning the copper-based layer may be improved, and thus a reliability of manufacturing a metal pattern and a display substrate may be improved.

Although exemplary embodiments in accordance with the present disclosure have been described, it is understood that the present teachings should not be limited to these exemplary embodiments and that various changes and modifications can be made by one ordinary skilled in the art in view of the present disclosure and within the spirit and scope of the teachings provided herein.

What is claimed is:

1. A method of forming a metal pattern having at least a portion thereof disposed over an active layer of a switching element, the method comprising:

forming, on a base substrate having material of the active layer pre-disposed thereon, a copper-based metal layer having a predetermined thickness between about 1,500 Å and about 5,500 Å;

forming a patterned photoresist layer above the copper-based metal layer; and first etching through the thickness of the un-patterned copper-based metal layer while not substantially removing an underlying active layer, the first etching simultaneously providing a sidewall in-cutting of the copper-based metal layer in accordance with a predetermined skew length, the first etching being an over-etching through said thickness that has an over-etch factor of between about 40% to about 200%, said first etching using the patterned photoresist layer as an etch stopping layer and using an etching composition including ammonium persulfate between about 0.1% by weight to about 50% by weight, an azole-based compound between about 0.01% by weight to about 5% by weight and a remainder including water, to form the metal pattern disposed over the active layer;

wherein the combination of the predetermined thickness of the copper-based metal layer and the concentration of the azole-based compound are pre-selected so as to provide said non-removal of the underlying active layer and to provide said predetermined skew length.

2. The method of claim 1, wherein the azole-based compound comprises at least one selected from the group consisting of benzotriazole, aminotetrazole, imidazole and pyrazole.

3. The method of claim 1, wherein the first etching is carried out for between about 30 seconds to about 70 seconds to thereby etch through the copper-based layer while using the etching composition.

4. The method of claim 1, wherein the copper-based layer is over-etched by between about 100% and about 200% when a thickness of the copper-based layer is between about 1,500 Å and about 2,500 Å.

5. The method of claim 4, wherein the copper-based layer is etched for between about 31 seconds and about 46 seconds.

6. The method of claim 4, wherein a skew length between an edge portion of the patterned photoresist layer and an edge portion of the metal pattern is between about 0.31 µm and about 0.50 µm.

7. The method of claim 1, wherein the copper-based layer is over-etched by between about 60% and about 120% when a thickness of the copper-based layer is between about 2,500 Å and about 3,500 Å.

8. The method of claim 7, wherein the copper-based layer is etched for between about 35 seconds and about 51 seconds.

9. The method of claim 7, wherein a skew length between an edge portion of the patterned photoresist layer and an edge portion of the metal pattern is between about 0.38 µm and about 0.56 µm.

10. The method of claim 1, wherein the copper-based layer is over-etched by between about 50% and about 100% when a thickness of the copper-based layer is between about 3,500 Å and about 4,500 Å.

11. The method of claim 10, wherein the copper-based layer is etched for between about 40 seconds and about 61 seconds.

12. The method of claim 10, wherein a skew length between an edge portion of the patterned photoresist layer and an edge portion of the metal pattern is between about 0.5 µm and about 0.7 µm.

13. The method of claim 1, wherein the copper-based layer is over-etched by between about 20% and about 80% when a thickness of the copper-based layer is between about 4,500 Å and about 5,500 Å.

14. The method of claim 13, wherein the copper-based layer is etched for between about 46 seconds and about 69 seconds.

15. The method of claim 13, wherein a skew length between an edge portion of the patterned photoresist layer and an edge portion of the metal pattern is between about 0.6 µm and about 0.8 µm.

16. The method of claim 1, wherein the copper-based layer is over-etched at a temperature between about 25° C. and about 33° C.

17. The method of claim 1, wherein a sidewall surface of the metal pattern is inclined with respect to a surface of the base substrate by between about 40° and about 70°.

18. The method of claim 1, wherein a skew length (undercut distance) between an edge portion of the patterned photoresist layer and an edge portion of the metal pattern is caused to be between about 0.3 µm and about 0.8 µm.

19. The method of claim 1, wherein the active layer is a semiconductor layer.

20. The method of claim 19, wherein the underlying active layer material further includes an ohmic contact layer disposed on the semiconductor layer.

21. A method of forming a metal pattern having at least a portion thereof disposed over an active layer of a switching element, the method comprising:

forming, on a base substrate having material of the active layer pre-disposed thereon, a copper-based layer having a thickness between about 1,500 Å and about 5,500 Å;

forming a patterned photoresist layer on the copper-based layer; and first etching through the copper-based layer, while not substantially removing an underlying active layer, the first etching simultaneously providing a sidewall in-cutting of the copper-based layer in accordance with a predetermined skew length, said first etching using the patterned photoresist layer as an etch stopping layer and using an etching composition including ammonium persulfate between about 0.1% by weight and about 50% by weight, an azole-based compound between about 0.01% by weight and about 5% by weight and a remainder including water for between about 30 seconds and about 70 seconds, to form the metal pattern disposed over the active layer.

22. The method of claim 21, wherein the copper-based layer is etched for between about 31 seconds and about 46 seconds when a thickness of the copper-based layer is between about 1,500 Å and about 2,500 Å.

23. The method of claim 22, wherein a skew length between an edge portion of the patterned photoresist layer and an edge portion of the metal pattern is between about 0.31 µm and about 0.50 µm.

24. The method of claim 21, wherein the copper-based layer is etched for between about 37 seconds and about 51 seconds when a thickness of the copper-based layer is between about 2,500 Å and about 3,500 Å.

25. The method of claim 24, wherein a skew length between an edge portion of the patterned photoresist layer and an edge portion of the metal pattern is between about 0.38 µm and about 0.56 µm.

26. The method of claim 21, wherein the copper-based layer is etched for between about 40 seconds and about 61 seconds when a thickness of the copper-based layer is between about 3,500 Å and about 4,500 Å.

27. The method of claim 26, wherein a skew length (undercut distance) between an edge portion of the patterned photoresist layer and an edge portion of the metal pattern is caused to be between about 0.5 µm and about 0.7 µm.

28. The method of claim 26, wherein a skew length between an edge portion of the patterned photoresist layer and an edge portion of the metal pattern is between about 0.6 µm and about 0.8 µm.

29. The method of claim 21, wherein the copper-based layer is etched for between about 46 seconds and about 69 seconds when a thickness of the copper-based layer is between about 4,500 Å and about 5,500 Å.

30. The method of claim 21, wherein the copper-based layer is etched at a temperature between about 25° C. and about 33° C.

31. The method of claim 21, wherein a sidewall surface of the metal pattern is inclined with respect to a surface of the base substrate by between about 40° and about 70°.

32. The method of claim 21, wherein the active layer is a semiconductor layer.

33. The method of claim 32, wherein the underlying active layer further includes an ohmic contact layer disposed on the semiconductor layer.

34. A method of manufacturing a display substrate, the method comprising:

forming, on a base substrate having material of at least an active layer pre-disposed thereon, a first metal layer including copper and having a thickness between about 1,500 Å and about 5,500 Å on a base substrate;

first etching through the thickness of the first metal layer while not substantially removing an underlying active layer the first etching simultaneously providing a sidewall in-cutting of the first metal layer in accordance with a predetermined skew length, the first etching being an over-etching through said thickness that has an over-etch factor of between about 40% and about 200%, the first etching using a first patterned photoresist layer as an etch stopping layer formed on the first metal layer and using an etching composition including ammonium persulfate between about 0.1% by weight and about 50% by weight, an azole-based compound between about 0.01% by weight and about 5% by weight and a remainder including water, to form a first metal pattern;

after said first forming of the first metal pattern, forming a second metal pattern including spaced apart source and drain electrodes disposed on the active layer; and after said first forming of the spaced apart source and drain electrodes, forming a pixel electrode that is electrically coupled to the drain electrode.

35. The method of claim 34, wherein forming the second metal pattern comprises:

over-etching through a portion of the first metal layer with an over-etch factor of between about 20% and about 150% using the etching composition, to thereby form said spaced apart source and drain electrodes.

36. The method of claim 34, wherein fouling the second metal pattern comprises:

over-etching through a portion of the first metal layer using the etching composition for between about 30 seconds and about 45 seconds.

37. The method of claim 34, wherein forming the first metal pattern comprises:

using a patterned photoresist layer including a first thickness portion and a second thickness portion thinner than the first thickness portion;

over-etching the first metal layer between about 80% and about 420%, using the patterned photoresist layer having the first and second thickness portions as an etch stopping layer and using the etching composition;

performing an etch-back for the second patterned photoresist layer to form a remaining pattern, the second thickness portion being removed from the second patterned photoresist layer to form the remaining pattern; and thereafter forming the second metal pattern by over-etching at a factor between about 20% and about 150%, using the remaining pattern as an etch stopping layer and using the etching composition.

38. The method of claim 34, wherein the first metal layer is over-etched for between about 30 seconds and about 70 seconds.

39. The method of claim 34, wherein the active layer is a semiconductor layer.

40. The method of claim 39, wherein the underlying active layer further includes an ohmic contact layer disposed on the semiconductor layer.

41. A method of manufacturing a display substrate, the method comprising:

forming, on a base substrate having material of the active layer pre-disposed thereon, a first metal layer including copper and having a thickness between about 1,500 Å and about 5,500 Å;

etching the first metal layer, using a first patterned photoresist layer formed on the first metal layer as an etch stopping layer and using an etching composition including ammonium persulfate between about 0.1% by weight and about 50% by weight, an azole-based compound between about 0.01% by weight and about 5% by weight and a remainder of water for between about 30 seconds and about 70 seconds, to form a first metal pattern including a first signal line, wherein the etching of the first metal layer does not substantially remove an underlying active layer;

forming a second metal pattern including spaced apart source and drain electrodes; and forming a pixel electrode electrically coupled to the drain electrode.

42. The method of claim 41, wherein forming the second metal pattern comprises:

over-etching at a factor of between about 20% and about 150% using the etching composition, to thereby form the spaced apart source and drain electrodes.

* * * * *